United States Patent
Miura et al.

(10) Patent No.: US 7,513,981 B2
(45) Date of Patent: Apr. 7, 2009

(54) MANUFACTURING APPARATUS OF SEMICONDUCTOR DEVICE

(75) Inventors: Kazutaka Miura, Kawasaki (JP); Shozo Noda, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 587 days.

(21) Appl. No.: 11/089,538

(22) Filed: Mar. 25, 2005

(65) Prior Publication Data
US 2005/0241932 A1 Nov. 3, 2005

Related U.S. Application Data

(63) Continuation of application No. PCT/JP03/03600, filed on Mar. 25, 2003.

(51) Int. Cl.
C23C 14/02 (2006.01)

(52) U.S. Cl. .................. 204/298.07; 204/298.09; 204/298.13; 204/298.25; 204/298.02

(58) Field of Classification Search ............ 204/298.07, 204/192.1–192.32
See application file for complete search history.

(56) References Cited

U.S. PATENT DOCUMENTS

| | | | | |
|---|---|---|---|---|
| 4,654,231 A | * | 3/1987 | Nyberg et al. | 427/255.31 |
| 4,951,602 A | * | 8/1990 | Kanai | 118/719 |
| 5,037,516 A | * | 8/1991 | Buck | 204/192.15 |
| 5,857,474 A | * | 1/1999 | Sakai et al. | 134/102.3 |
| 6,368,880 B2 | * | 4/2002 | Singhvi et al. | 438/5 |
| 2002/0142144 A1 | | 10/2002 | Zhang et al. | |
| 2003/0037843 A1 | | 2/2003 | Hishida | |

FOREIGN PATENT DOCUMENTS

JP 08139307 5/1996

OTHER PUBLICATIONS

T. Ohwaki et al., Preferred Orientation in Ti Films Sputter-Deposited on $SiO_2$ Glass: The Role of Water Chemisorption on the Substrate, J. Appl. Phys. vol. 36 (1997) pp. L 154-L 157, Part 2, No. 2A, Feb. 1, 1997.
Takeshi Ohwaki et al.; "Preferred Orientation in Ti Films Sputter-Deposited on $SiO_2$ Glass: The Role of Water Chemisorption on the Substrate"; *Jpn. J. Appl. Phys.*; Feb. 1, 1997; pp. L154-L157; vol. 36 (1997), Part 2, No. 2A; Toyota Central R & D Laboratories Inc.; Aichi, Japan.

* cited by examiner

*Primary Examiner*—Nam X Nguyen
*Assistant Examiner*—Jason M Berman
(74) *Attorney, Agent, or Firm*—Westerman, Hattori, Daniels & Adrian, LLP.

(57) ABSTRACT

A load lock chamber (12) is connected in a front stage of a film forming chamber (11) through a damper and the like. A pipe to which a $N_2$ gas and aeriform or fog-like $H_2O$ are supplied is connected to the load lock chamber (12). The pipe is led from a vaporizer (13). Inside the load lock chamber (12), a carrying section 15 on which a wafer (20) is placed is provided, whereas outside the load lock chamber (12), a cooler (14) cooling a carrying section (15) by means of liquid nitrogen is arranged. The temperature of the carrying section 15 is held at, for example, −4° C.

12 Claims, 3 Drawing Sheets

MANUFACTURING APPARATUS OF SEMICONDUCTOR DEVICE

This application is a continuation of international application PCT/JP03/03600 filed on Mar. 25, 2003.

TECHNICAL FIELD

The present invention related to a manufacturing apparatus and a manufacturing method of a semiconductor device suitable for a formation of a ferroelectric capacitor or an Al wiring.

BACKGROUND ART

In a ferroelectric capacitor used for a ferroelectric memory and the like, it is known that an oblique orientation (<111>, <222> etc.) of a capacitor film (a $LiTaO_3$ film, Pb (Zr, Ti) $O_3$ (PZT) film etc.) becomes strong so that a capacitor characteristic improves. Conventionally, the improvement of orientation is intended by optimizations of a film forming condition of the capacitor film itself or an annealing condition, however, in recent years, a method of improving the orientation more effectively is required.

With respect to such request, it is known that the stronger a c-axis orientation becomes, the stronger the oblique orientation of the capacitor becomes in a crystal orientation of a bottom electrode of the ferroelectric capacitor having a planar structure, and a method of intensifying the c-axis orientation of the bottom electrode is being considered.

Concerning an Al wiring used in various kinds of semiconductor devices, a base metal film is formed in order to improve a migration endurance, and a high orientation for the film as well as a thicker film are required for acquiring a high effect.

As materials for the bottom electrode and the base metal film, refractory metal films such as Ti, Ta and the like are chiefly used, which are formed, in general, by a DC magnetron sputtering method and so on. In addition, for the improvement of the c-axis orientation of the base metal film, there exist a method of mixing moisture with sputtering gas (Ar gas).

However, when a Ti film is formed by the DC magnetron sputtering method, the orientation of Ti sometimes fluctuate, depending on an ultimate vacuum of a film forming chamber and a processing lot number.

Sufficient orientation can not be obtained by merely mixing the moisture with the sputtering gas. And further, if the moisture adheres to a jig of a film forming chamber, the moisture causes an abnormal discharge (arc-plasma), as a result, the discharge is not stabilized and a hillock or a foreign substance sometimes occur. In addition, oxygen in the moisture remains for a long time, and the oxidation of the base metal film is possibly brought about. As a result, problems such as a peeling and the increase of resistance happen to occur, which contrarily cause the decrease of migration.

Non-Patent Document 1

"Preferred Orientation in Ti Films Sputter-Deposited on SiO2 Glass: The Role of Water Chemisorption on the Substrate" by Oowaki et al, in Japanese Journal of Applied Physics issued on 1 Feb. 1997, vol. 36, p. L154-L157.

SUMMARY OF THE INVENTION

The object of the present invention is to provide a manufacturing apparatus and a manufacturing method of a semiconductor device capable of forming a refractory metal film with a high orientation.

A manufacturing apparatus of a semiconductor device according to the present invention includes a film forming chamber and a metal film former forming a metal film above a semiconductor substrate in the film forming chamber. The manufacturing apparatus further includes a moisture supplier allowing a metal film to contain moisture only at an early stage on the occasion of forming the metal film by the metal film former.

In a manufacturing method of a semiconductor device according to the present invention, first, aeriform or fog-like $H_2O$ is supplied to a surface of a semiconductor substrate in a preprocessing chamber with a temperature of the semiconductor substrate held at 0° C. or lower. Subsequently, the semiconductor substrate is carried to the film forming chamber. Then, a metal film is formed above the semiconductor substrate in the film forming chamber.

DETAILED DESCRIPTION OF THE PREFERRED EMBODIMENTS

Hereinafter, some embodiments of the present invention will be described with reference to the drawings.

First Embodiment

Figure 1:
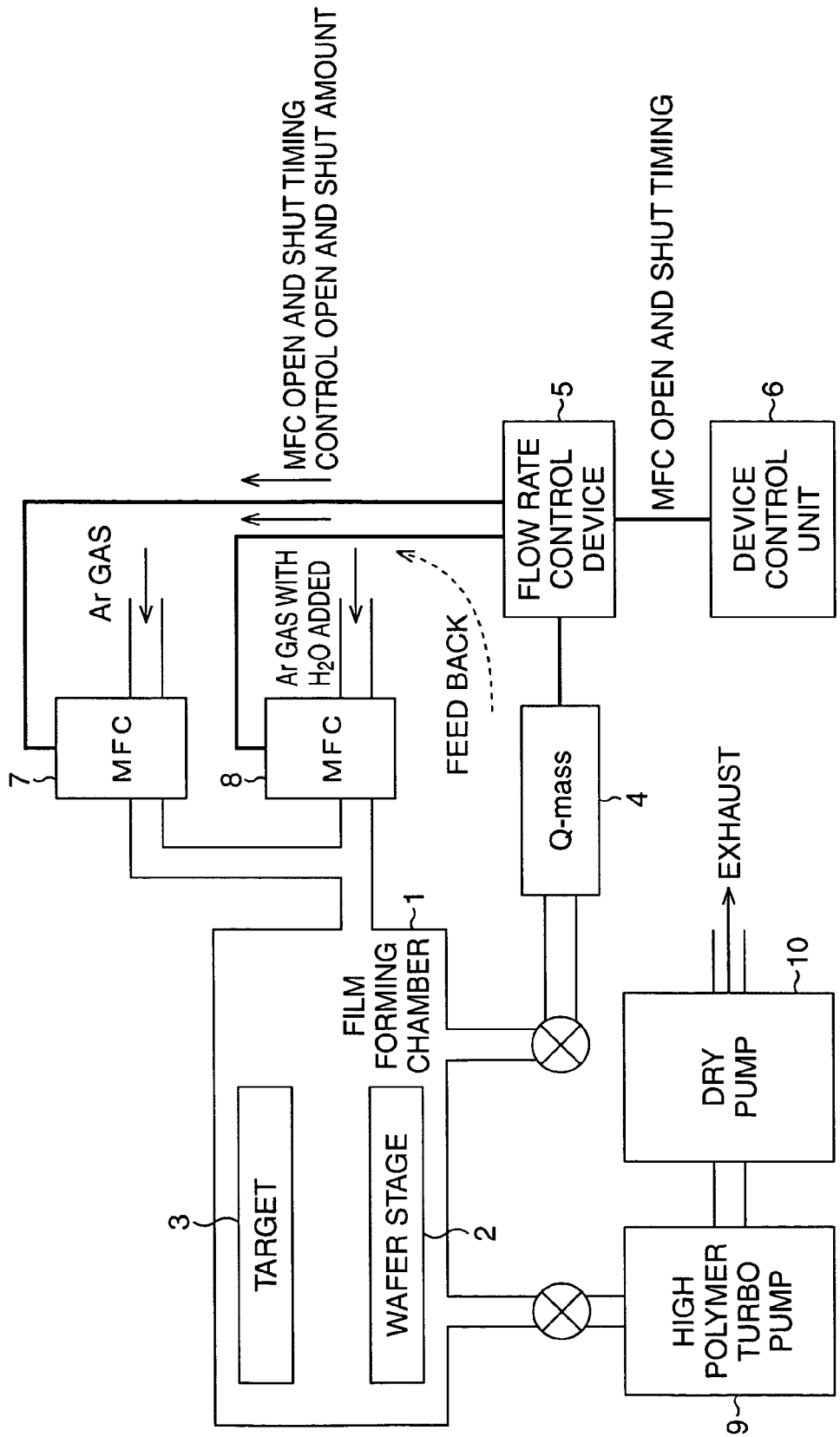
FIG. 1 is a schematic diagram showing a manufacturing apparatus of a semiconductor device according to a first embodiment of the present invention.

First, a first embodiment of the present invention will be described. FIG. 1 is a schematic diagram showing a manufacturing apparatus of a semiconductor device according to the first embodiment of the present invention.

In the present embodiment, inside a film forming chamber 1, a wafer stage 2 on which a wafer is placed, and a target 3 used in a sputtering, for example, a Ti target are provided. Besides, a load lock chamber (not shown) is provided in the front stage of the film forming chamber 1.

At a drainage side of the film forming chamber 1, a high polymer turbo pump 9 and a dry pump 10 are connected in series through a valve. And a quadruple mass spectrometer (Q-mass) 4 measuring a moisture content in the film forming chamber 1 based on a partial pressure is also connected to the film forming chamber 1 through a valve.

Furthermore, at an input side of the film forming chamber 1, a supply line for a pure Ar gas and a supply line for an Ar gas with $H_2O$ added thereto (a first adder) are connected. Mass flow controllers (MFC) 7 and 8 are provided in these supply lines respectively.

To the quadruple mass spectrometer 4, a flow rate control device 5 controlling the flow rate of the gas for supplying to the film forming chamber 1 by controlling opening rates of the mass flow controllers 7 and 8 when they are on. An added amount controller is composed of the flow rate control device 5 and the mass flow controller 8. In addition, a device control unit 6 controlling the on/off of the mass flow controllers 7 and 8 is connected to the flow rate control device 5.

Next, the operation of the manufacturing apparatus of the semiconductor device constituted as described above and the manufacturing method of a ferroelectric memory (a semiconductor device) employing the manufacturing apparatus will be described.

First, formation of semiconductor elements such as a control transistor, formation and planarization of an interlayer insulating film, formation of a contact hole, and formation of a tungsten (W) plug, and so on are performed on a semiconductor wafer such as a silicon wafer.

Subsequently, using the above manufacturing apparatus of the semiconductor device, a Ti film as a part of a bottom electrode film of a ferroelectric capacitor is formed by a DC sputtering method. The states of the mass flow controllers 7 and 8 when the Ti film is formed are shown in Table 1.

On the occasion of forming the Ti film, after the semiconductor wafer is placed on the wafer stage 2, the mass flow controllers 7 and 8 are allowed to be on-state in order to stabilize the gas inside the film forming chamber 1. The operations allowing the mass flow controllers 7 and 8 to be on-state are controlled by the device control unit 6.

After three seconds passes from the switching to on-state of the mass flow controllers 7 and 8, formation of the Ti film is actually begun. As a film forming condition at that time, for example, a film forming temperature is a room temperature, a thickness of the Ti film is 20 nm, a DC power is 2.06 kW, and a flow rate of the Ar gas is 100 sccm. An opening rate of the mass flow controller 8 is controlled such that the moisture content in the film forming chamber 1 is to be the predetermined value, for example, approximately 10 to 300 ppm by the flow rate control device 5, with the moisture content in the film forming chamber 1 being detected by means of the quadruple mass spectrometer 4.

When five seconds passes from the actual beginning of the formation of the Ti film, the mass flow controller 8 is allowed to be off-state by the control of the device control unit 6. Namely, a moisture supply to the film forming chamber is cut off and only the Ar gas is supplied.

When five to ten seconds passes after the mass flow controller 8 is shut, the formation of the Ti film ends.

In the sequence of forming process of the Ti film, after the mass flow controller 8 is allowed to be on-state, it is allowed to be off. Therefore, in a period of on-state of the mass flow controller 8, a sputtering gas contains moisture and the moisture exists in the film forming chamber 1. In parallel with that, the moisture content in the film forming chamber 1 is controlled by means of the quadruple mass spectrometer 4. As a result, the Ti film having a strong c-axis orientation can be formed stably without being affected by an ultimate vacuum of the film forming chamber 1, a processing lot number and the like.

In order to align the orientation of a crystal, it is highly important to control the orientation at the beginning of deposition of the film. If the strong orientation can be obtained at the beginning, the moisture does not need to be supplied after that. On the other hand, when the moisture is continued being supplied, there is a fear that the increase of resistance since oxide is formed in the Ti film. Thus, in the film forming process described above, though the moisture is supplied at an early stage, after that, the moisture supply is stopped by allowing the mass flow controller 8 to be off-state.

After the Ti film is formed, a Pt film is formed on the Ti film as another part of the bottom electrode film by a DC sputtering method in a different chamber from the film forming chamber 1. As the film forming condition at that time, for example, the film forming temperature is 100° C., the thickness of the Pt film is 175 nm, the DC power is 1.04 kW, and the flow rate of the Ar gas is 100 sccm. No addition of the moisture to the Ar gas is performed.

Subsequently, a PZT film is formed on the Pt film as a capacitor film by a RF sputtering method. As the film forming condition at that time, for example, the film forming temperature is the room temperature, the thickness of the PZT film is 200 nm, the RF power is 1.0 kW and the flow rate of the Ar gas is 15 to 25 sccm. At that time, the flow rate of the Ar gas is controlled suitably to adjust a Pb content in the PZT film. After the PZT film is formed, a crystallization annealing is performed.

Note that the formation of the PZT film can be performed by a sol-gel method, a MOCVD method or the like, besides the RF sputtering method. In addition, impurities such as Ca, Sr, and La etc. can be doped into the PZT film in accordance with a required capacitor characteristic.

After the PZT film is formed, an $IRO_x$ film is formed in two stages, as a top electrode film of the ferroelectric capacitor by a sputtering method. As the film forming condition at that time, for example, the film forming temperature is 20° C., and the thickness of the $IRO_x$ film is 200 nm. In the first stage, the DC power is 1.04 kW, the flow rate of the Ar gas is 100 sccm, the flow rate of an $O_2$ gas is 100 sccm, and a film forming time is 29 seconds. In the second stage, the DC power is 2.05 kW and the flow rate of the Ar gas is 100 sccm, the flow rate of the $O_2$ gas is 100 sccm, and the film forming time is 22 seconds.

After that, the $IRO_x$ film, the PZT film, the Pt film and the Ti film are processed to a shape of the ferroelectric capacitor by a photography technique and an etching. Further, formation and polarization of other interlayer insulating film(s), formation of other contact hole(s), and formation of other wiring(s) and so on are performed to complete the ferroelectric memory.

According to the first embodiment thus described, the moisture content in the film forming chamber 1 is detected by means of the quadruple mass spectrometer 4, and by feeding back the detected result, the moisture content can be controlled. Therefore, by suitably controlling the moisture content contributing to the orientation of the Ti film, the stable orientation can be obtained.

Note that a general-purpose computer to which a control program is installed, for example, can be used as the flow rate control device 5.

Second Embodiment

Figure 2:
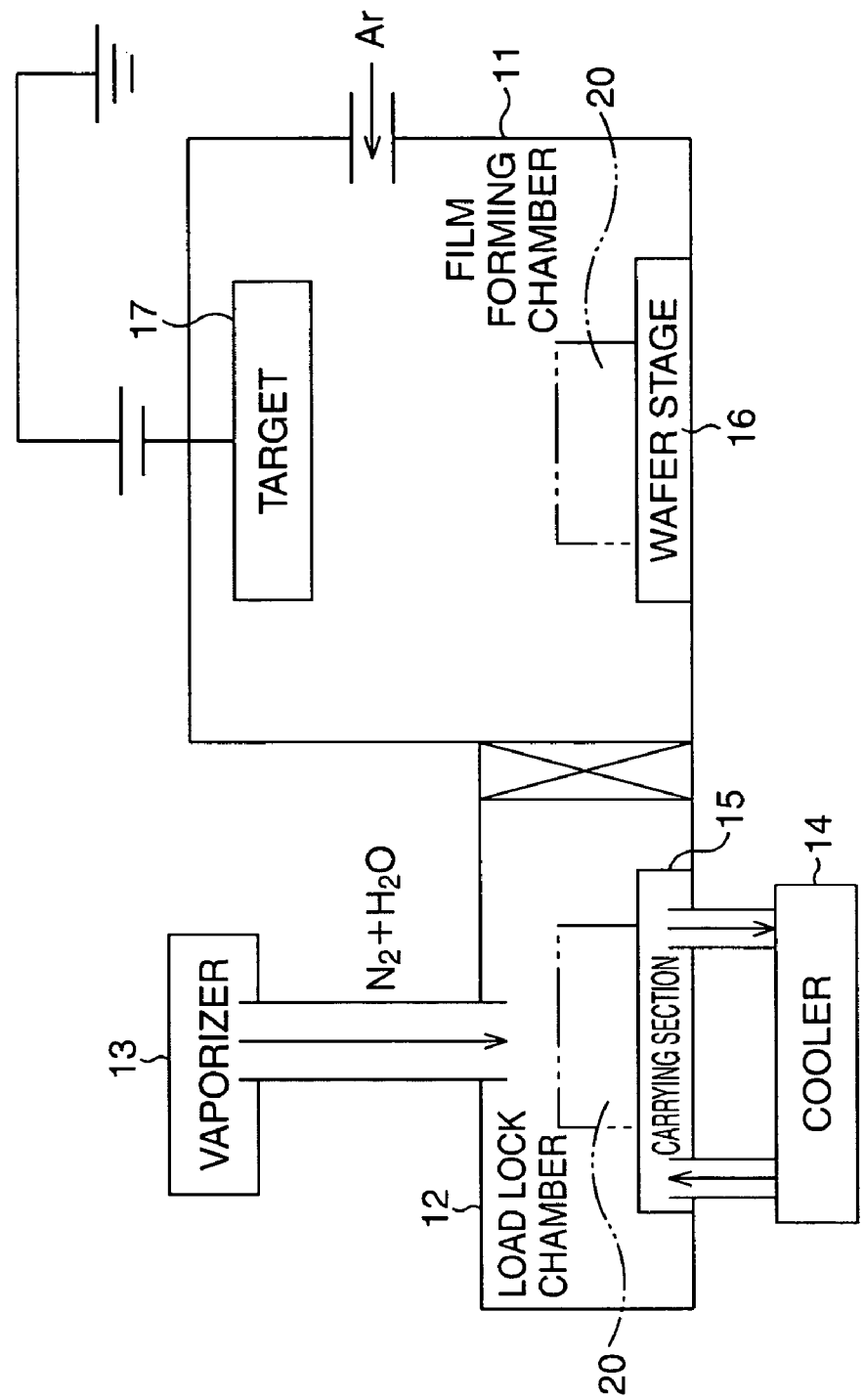
FIG. 2 is a schematic diagram showing a manufacturing apparatus of a semiconductor device according to a second embodiment of the present invention.
Figure 3A:
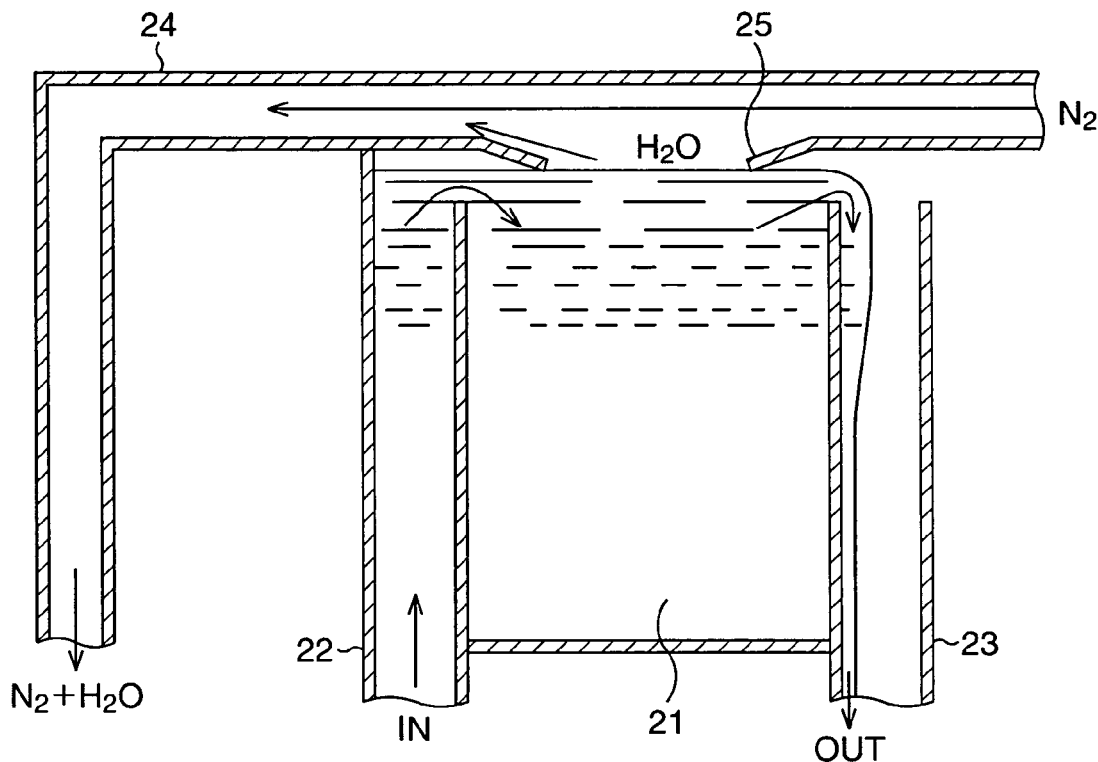
FIG. 3A is a sectional view showing a vaporizer provided in the second embodiment.

Next, a second embodiment of the present invention will be described. FIG. 2 is a schematic diagram showing a manufacturing apparatus of a semiconductor device according to the second embodiment of the present invention. FIG. 3A is a sectional view showing a vaporizer provided in the second embodiment, and FIG. 3B is a sectional view showing the inside of pipes provided in the vaporizer.

In the present embodiment, as shown in FIG. 2, a load lock chamber (a preprocessing chamber) 12 is connected in the front stage of a film forming chamber 11 through a damper and the like. A pipe through which a $N_2$ gas and aeriform or fog-like $H_2O$ are supplied is connected to the load lock chamber 12. The pipe is led from a vaporizer (moisture supplier before forming film) 13.

Figure 3B:
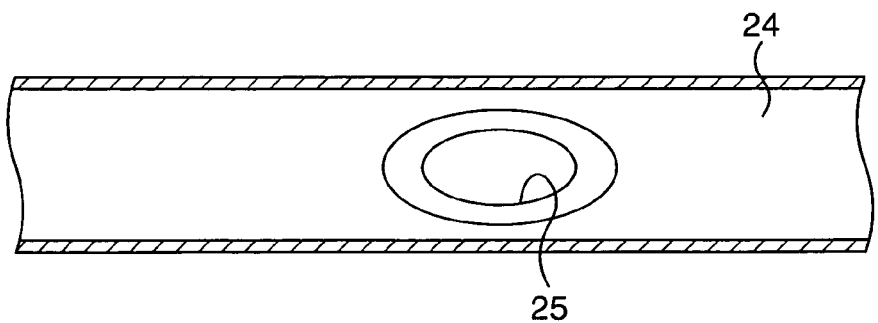
FIG. 3B is a sectional view showing the inside of pipes provided in the vaporizer.

In vaporizer 13, as shown in FIG. 3A and FIG. 3B, a water tank (a second adder) 21, a water pipe 22 and a drainage pipe 23 are provided. A pipe 24 through which the $N_2$ gas flows is arranged just above the water tank 21. An opening 25 is formed at the pipe 24 such that the opening touches the surface of the stored water in the water tank 21. The pipe 24 is the one connected to the load lock chamber 12.

In the vaporizer 13 thus constructed, when the $N_2$ gas flows through the pipe 24 under the condition that the water tank 21 is filled with water supplied from the water pipe 22 to the water tank 21, the water in the water tank 21 is vaporized, and water vapor floating above the water surface flows through the pipe 24 along with the $N_2$ gas.

Inside the load lock chamber 12, a carrying section (stage) 15 on which a wafer 20 is placed is provided, whereas outside the load lock chamber 12, a cooler 14 cooling the carrying section 15 by means of liquid nitrogen is provided. The temperature of the carrying section 15 is held at 0 (zero) ° C. or lower, for example, at −4° C. In the carrying section 15, a carrying roller of which width is narrower than a diameter of the wafer 20 is arranged.

Meanwhile, inside the film forming chamber 1, a wafer stage 16 on which the wafer 20 is placed, and a target 17 used in a sputtering, for example, a Ti target are provided. A supply line for the Ar gas is connected at an input side of the film forming chamber 1. A negative bias, for example, is applied to the target 17.

Furthermore, in the second embodiment, a pump (a vacuum apparatus), not shown, which lowers pressures in the film forming chamber 11 and the load lock chamber 12 to $10^{-3}$ or lower is provided.

Next, the operation of the manufacturing apparatus of the semiconductor device constituted as described above and the manufacturing method of a ferroelectric memory (a semiconductor device) employing the manufacturing apparatus will be described.

First, as same as the first embodiment, a formation of semiconductor elements such as a control transistor, formation and planarization of an interlayer insulating film, formation of a contact hole, and formation of a tungsten (W) plug, and so on are performed on a semiconductor wafer such as a silicon wafer.

Subsequently, by using the above manufacturing apparatus of the semiconductor device, a Ti film as a part of a bottom electrode film of a ferroelectric capacitor is formed by means of a DC sputtering method.

On the occasion of the formation of the Ti film, first, a semiconductor wafer 20 is placed on the carrying section 15. And water is supplied to the water tank 21 through the water pipe 22 at a flow rate of 20 $mm^3$/minute, for example. The water overflowed from the water tank 21 is drained out through the drainage pipe 23. Besides, the $N_2$ gas flows through the pipe 24 at the flow rate of 60 sccm. As a result, the water vapor ($H_2O$ gas) vaporized from the water tank 21 is supplied into the load lock chamber 12 along with the $N_2$ gas. And further, the temperature of the carrying section 15 is held, for example, at −4° C., in parallel with that.

Resultingly, inside the load lock chamber 12, the water vapor supplied from the pipe 24 becomes fog-like liquid. The temperature of the wafer 20 becomes 0 (zero) ° C. or lower, and the $N_2$ gas including the moisture is supplied to the surface thereof. Therefore, after water droplets adhere to the surface of the wafer 20, they are frozen.

After that, the semiconductor wafer 20 is carried to the film forming chamber 11 with the cooling of the carrying section 15 maintained.

Then, the formation of Ti film is begun with the Ar gas as a sputtering gas supplied in the film forming chamber 11. The moisture adhering to the surface of the wafer 20 and frozen becomes liquid in the film forming chamber 11. Since the deposition of the Ti film is begun under this state, the moisture is suitably brought into the Ti film. As a result, the Ti film having a high c-axis orientation is formed. In addition, the moisture is used at the beginning of forming the Ti film so that oxidation of the Ti hardly occurs at upper major part of the Ti film in a thickness direction. Though there exist some moisture vaporized in the film forming chamber 11, this is not responsible for the oxidation of the Ti and is absorbed into the Ti film. Therefore, the moisture hardly adheres to a jig in the film forming chamber 11 so that an abnormal discharge due to the adhesion can be prevented.

After the Ti film is formed, as same as the first embodiment, the formations of a Pt film, a PZT film, an $IrO_x$ film and the like are performed to complete the ferroelectric memory.

According the second embodiment thus described, since the moisture is allowed to adhere on the wafer 20 in advance without supplying the moisture from the outside during the formation of the Ti film, the moisture adhesion to the jig in the film forming chamber 11 is prevented. As a result, the abnormal discharge can be prevented. And further, the remains of the moisture for a long time can be prevented so that unnecessary oxidation can be avoided and a peeling of the Ti film and the increase of resistance can be prevented. Besides, since the moisture is brought into the Ti film at the begging of forming the Ti film, the high c-axis orientation can be obtained.

Hereinafter, a characteristic of the Ti film actually formed by means of the manufacturing apparatus of the semiconductor device according the second embodiment will be described, being compared with a comparative example.

First, a semiconductor wafer on which a $SiO_2$ film having the thickness of 100 nm had been formed at the surface thereof was prepared as a specimen. And a Ti film having the thickness of 100 nm was formed on the semiconductor wafer. At that time, in the above embodiment, the moisture was allowed to adhere to the semiconductor wafer by means of the manufacturing apparatus of the semiconductor device according to the second embodiment, whereas, in the comparative example, moisture was not allowed to adhere to the wafer and a baking was performed at 150° C. in the load lock chamber.

The adhesion of the moisture was performed in the following condition. First, the water was supplied to the water tank 21 at the flow rate of 20 $mm^3$/minute. And the $N_2$ gas was allowed to flow through the pipe 24 at the flow rate of 60 sccm. Then, the temperature of the carrying section 15 was held at −4° C. Under such condition, the adhesion of the moisture was begun, and the supplies of the $N_2$ gas and the water vapor were stopped when an observation window (not shown) provided in the load lock chamber 12 was misted. After that, the specimen (semiconductor wafer 20) is carried to the film forming chamber 11 with the cooling of the carrying section 15 being maintained.

After the Ti film was formed, the orientation of crystal in the Ti film was analyzed by means of an X-ray diffraction (XRD). The result of that is shown in Table 2. As shown in Table 2, according to the embodiment, the high c-axis orientation can be obtained.

Note that other inert gases such as a He gas, a Ne gas, an Ar gas or the like can be used as a carrier gas in the vaporizer 13, instead of the $N_2$ gas.

Additionally, as a refrigerant in the cooler 14, alternative chlorofluorocarbons or the He gas can be used instead of the liquid nitrogen.

Furthermore, in the first and second embodiment, the Ti film is formed as a metal film, however, other refractory metal films of, for example, Ta, W, and Mo etc. can be formed.

The first embodiment may be combined with the second embodiment. Namely, the load lock chamber 12 and the like shown in FIG. 2 can be provided in the front stage of the film forming chamber 1 shown in FIG. 1.

Furthermore, the semiconductor device to be manufactured is not limited to the ferroelectric memory, and the present invention can be applied to the occasions of fabricating other semiconductor devices having, for example, an Al wiring.

INDUSTRIAL APPLICABILITY

As described above, according to the present invention, the moisture is supplied on the occasion of forming a metal film so that a strong c-axis orientation can be obtained. Besides, since the supply of moisture can be performed only at the early stage of the film forming with the rate thereof being controlled, the dispersion of orientation can be suppressed and the generation of abnormal discharge due to the unnecessary supply can be restrained.

TABLE 1

| | Time | MFC 7 for pure Ar gas | MFC 8 for Ar gas with $H_2O$ added |
|---|---|---|---|
| Gas stabilization | 3 seconds | on | on |
| Formation of Ti film | 5 seconds 5 to 10 seconds | on off | on off |

TABLE 2

| | Peak intensity (cps) | | Full Width at Half Maximum (degree) | |
|---|---|---|---|---|
| | c-axis orientation Ti<002> | Oblique orientation Ti<101> | c-axis orientation Ti<002> | Oblique orientation Ti<101> |
| Embodiment | 708 | 1502 | 0.49 | 0.60 |
| Comparative example | 1485 | 506 | 0.53 | 0.43 |

What is claimed is:

1. A manufacturing apparatus of a semiconductor device comprising:
    a film forming chamber;
    a metal film former forming a metal film above a semiconductor substrate in said film forming chamber;
    a preprocessing chamber connected to said film forming chamber;
    a stage within the preprocessing chamber on which said semiconductor substrate is placed;
    a moisture supplier allowing said metal film to contain moisture only at an early stage on occasion of forming the metal film by said metal film former, and
    wherein said moisture supplier comprises:
    a moisture supplier before forming film supplying aeriform or fog-like H2O to said preprocessing chamber, and
    a cooler cooling a temperature of said stage to 0° C. or lower.

2. The manufacturing apparatus of the semiconductor device according to claim 1, wherein said metal film former comprising:
    a sputtering target provided in a chamber; and
    a sputtering gas supplier supplying a sputtering gas to said chamber.

3. The manufacturing apparatus of the semiconductor device according to claim 2, wherein said moisture suppler comprises a first adder adding a H2O gas to said sputtering gas suppler.

4. The manufacturing apparatus of the semiconductor device according to claim 3, further comprising:
    a measurer measuring a moisture content in said chamber; and
    an added amount controller controlling an added amount of moisture by said first adder based on a content measured by said measurer.

5. The manufacturing apparatus of the semiconductor device according to claim 4, wherein said measurer comprises a quadrupole mass spectrometer.

6. The manufacturing apparatus of the semiconductor device according to claim 4, wherein said added amount controller comprises a mass flow controller.

7. The manufacturing apparatus of the semiconductor device according to claim 6, wherein said mass flow controller is provided at a pipe supplying a mixed gas of a H2O gas and an Ar gas to said chamber.

8. The manufacturing apparatus of the semiconductor device according to claim 2, wherein said sputtering target is made of a refractory metal film.

9. The manufacturing apparatus of the semiconductor device according to claim 1, wherein said moisture supplier before forming film comprising:
    a pipe through which an inert gas flows and connected to said preprocessing chamber; and
    a second adder adding a H2O gas into said pipe.

10. The manufacturing apparatus of the semiconductor device according to claim 1, wherein said cooler make a refrigerant flow inside said stage.

11. The manufacturing apparatus of the semiconductor device according to claim 1, further comprising a vacuum apparatus allowing pressures in said film forming chamber and in said preprocessing chamber to be 10-3 Pa or lower.

12. The manufacturing apparatus of the semiconductor device according to claim 1, wherein said stage comprises a carrying roller of which width is narrower than said semiconductor substrate.

* * * * *